(12) United States Patent
Dasgupta

(10) Patent No.: US 7,295,061 B1
(45) Date of Patent: Nov. 13, 2007

(54) FULLY INTEGRATED PROGRAMMABLE GAIN CHOPPER AMPLIFIER WITH SELF DC OFFSET SUPPRESSION

(75) Inventor: Uday Dasgupta, Singapore (SG)

(73) Assignee: Marvell International Ltd., Hamilton (BM)

( * ) Notice: Subject to any disclaimer, the term of this patent is extended or adjusted under 35 U.S.C. 154(b) by 126 days.

(21) Appl. No.: 11/115,578

(22) Filed: Apr. 26, 2005

Related U.S. Application Data

(60) Provisional application No. 60/606,747, filed on Sep. 2, 2004.

(51) Int. Cl.
*H03F 1/02* (2006.01)

(52) U.S. Cl. .......................................... 330/9; 327/124

(58) Field of Classification Search .................. 330/9; 327/124, 307
See application file for complete search history.

(56) References Cited

U.S. PATENT DOCUMENTS

| | | | |
|---|---|---|---|
| 4,331,929 A | 5/1982 | Yokoyama | |
| 4,855,685 A * | 8/1989 | Hochschild | ................. 330/282 |
| 5,097,223 A | 3/1992 | Alexander | |
| 5,351,012 A | 9/1994 | Toumazou | |
| 6,262,626 B1 * | 7/2001 | Bakker et al. | ................. 330/9 |
| 6,307,430 B1 | 10/2001 | Thomsen et al. | |
| 6,316,998 B1 | 11/2001 | Oikawa | |
| 6,429,735 B1 | 8/2002 | Kuo et al. | |
| 6,492,871 B2 | 12/2002 | Liu et al. | |
| 6,636,116 B2 | 10/2003 | Cameron | |
| 6,724,248 B2 | 4/2004 | Llewellyn | |
| 6,734,723 B2 | 5/2004 | Huijsing et al. | |
| 6,768,374 B1 * | 7/2004 | Lee | ................. 330/9 |
| 7,215,198 B1 | 5/2007 | Dasgupta | |
| 2002/0171474 A1 | 11/2002 | Wouters | |

OTHER PUBLICATIONS

Mahmoud, Soliman Awad, *Low Voltage Analog VLSI Circuits*, Cairo University—Theses; Electronics and Communications Department; Theses Registration Mar. 15, 1997 (Summary Only).
Schmid, Hanspeter, *The Current-Feedback OTA*, IEEE, Sep. 2001.
OPA684, *Low-Power, Current Feedback Operational Amplifier With Disable*, Texas Instruments Incorporated, SBOS219A—Mar. 2002.
EL2120, *100MHz Current Feedback Amplifier*, Intersil® Data Sheet, Jan. 1996, Rev. E.
AD8001, *800 MHz, 50 mW Current Feedback Amplifier*, Analog Devices, Inc. Specification Sheet, Rev. D, 2003.
Office Action dated Jul. 24, 2006 from related case US Patent Number 7215198.
Office Action dated May 10, 2006 from related case US Patent Number 7215198.
Office Action dated Jan. 20, 2006 from related case US Patent Number 7215198.

* cited by examiner

*Primary Examiner*—Henry Choe

(57) ABSTRACT

Chopper amplifiers and methods of amplification are provided. A circuit includes an adjustable modulation resistance network, an amplifier, and an adjustable feedback resistance network. The adjustable modulation resistance network receives and modulates an input signal to produce a modulated signal including varying an input resistance, which includes a switch resistance. The amplifier has an input and an output. The adjustable feedback resistance network varies a feedback resistance, which includes a switch resistance. In addition, a suppression circuit is also included that can produce the feedback signal for preventing the direct current offset signal from substantially affecting the output signal.

38 Claims, 12 Drawing Sheets

FULLY INTEGRATED PROGRAMMABLE GAIN CHOPPER AMPLIFIER WITH SELF DC OFFSET SUPPRESSION

CROSS-REFERENCE TO RELATED APPLICATIONS

The present application claims priority to U.S. Provisional Patent Application No. 60/606,747, filed on Sep. 2, 2004, which is incorporated herein by reference in its entirety. The present application is related to U.S. application Ser. No. 10/950,201, entitled "A FULLY DIFFERENTIAL CURRENT-FEEDBACK CMOS/BIPOLAR OPERATIONAL AMPLIFIER", filed on Sep. 24, 2004, which is commonly assigned, the contents of which is incorporated herein by reference.

BACKGROUND

The following disclosure generally relates to electrical circuits and signal processing.

Conventional amplifiers receive an input voltage and produce an output voltage according to a gain, where the gain is defined as a ratio of the output voltage to the input voltage. One type of amplifier is a chopper amplifier (sometimes referred to as a tuned amplifier).

FIG. 1 is a schematic diagram illustrating a conventional chopper amplifier 100. Chopper amplifier 100 includes a modulator 110, an operational amplifier 120, a demodulator 130, a filter 140, feedback resistors 150(1),(2), and input resistors 160(1),(2). Feedback resistors 150(1),(2) are coupled across the respective outputs and inputs of operational amplifier 120. A DC offset signal 153 is also coupled to an input of operational amplifier 120. Modulator 110 modulates an input signal 102 in accordance with a frequency of a carrier signal 104. Operational amplifier 120, amplifies the modulated input signal according to a gain defined as a ratio of feedback resistance to input resistance. Demodulator 130 returns the amplified signal to an original frequency. Lastly, filter 140 removes DC offset and DC noise, and produces output signal 190.

Conventional chopper amplifier performance suffers from many drawbacks. One problem is that chopper amplifiers are usually not able to maintain high gains. In a conventional chopper amplifier, a resistance associated with modulation switches unduly increases an input resistance, thus limiting gain. Another problem is that a DC offset applied to the operational amplifier may be amplified by the gain, causing a reduced output swing voltage that is insufficient for low voltage applications (e.g., 1.8V or 2.3V). Removal of the DC offset subsequent to an output of the operational amplifier fails to address the loss of full voltage output swing at the output of the operational amplifier. Furthermore, the amplified DC offset, if sufficiently high, can saturate the operational amplifier or subsequent circuitry. Yet another problem is that voltage-type operational amplifiers typically used in conventional chopper amplifiers diminish gain bandwidth with increase in gain, thereby requiring a low carrier frequency and a bulky output filter.

SUMMARY

This disclosure generally describes a chopper amplifier and methods of amplification of an input signal. In general, in one aspect, a circuit is provided. The circuit includes a controller to generate a first control signal and a second control signal for configuring a gain; an adjustable modulation resistance network, in communication with the controller, to receive and modulate an input signal to produce a modulated signal, the adjustable modulation resistance network varying an input resistance, which includes a first switch resistance, responsive to the first control signal; an amplifier having an input and an output and in communication with the adjustable modulation resistance network; an adjustable feedback resistance network, in communication with the controller and the amplifier, the adjustable feedback resistance network varying a feedback resistance, which includes a second switch resistance; a suppression circuit, in communication with the input and the output of the amplifier, to produce a feedback signal such that a gain bandwidth associated with the amplifier is substantially independent of a direct current offset signal; a demodulator, in communication with the amplifier, to demodulate the output signal associated with the amplifier so as to restore a substantially original frequency of the input signal; and a filter, in communication with the demodulator, to remove low frequency noise associated with the output signal.

In general, in another aspect, a circuit includes an adjustable modulation resistance network to receive and modulate an input signal and to produce a modulated signal, the adjustable modulation resistance network varying an input resistance which includes a first switch resistance; an amplifier having an input and an output, in communication with the adjustable modulation resistance network; and an adjustable feedback resistance network in communication with the amplifier, the adjustable feedback resistance network varying a feedback resistance, which includes a second switch resistance substantially equal to the first switch resistance.

Particular implementations can include one or more of the following features. The feedback resistance can be substantially inversely proportional to the input resistance to make a gain substantially independent of the first and second switch resistances. The adjustable modulation resistance network can vary the input resistance and the adjustable feedback resistance network can adjust the feedback resistance to produce a predetermined gain in the amplifier. The adjustable modulation resistance network can include sets of a switch in series with a gain-controlling resistance, wherein the adjustable modulation resistance network is operable to activate one or more of the sets to vary the input resistance. The adjustable modulation resistance network can be operable to activate at least one of the one or more sets in parallel to reduce the input resistance. The adjustable feedback resistance network can include sets of a switch in series with a feedback resistance, wherein the adjustable feedback resistance network activates one or more feedback resistances using an associated switch to vary the feedback resistance. The adjustable feedback resistance network can activate one or more of the sets of the switch in series with the feedback resistance to substantially equate the feedback resistance to the input resistance.

The circuit can further include a controller in communication with the adjustable modulation and adjustable feedback resistance networks, the controller generating a first control signal for configuring the adjustable modulation resistance network and a second control signal for configuring the adjustable feedback resistance network. The controller can produce the first and second control signals based on a gain-setting signal.

The circuit can further include a suppression circuit, in communication with the amplifier, to produce a feedback signal that is fed back to the amplifier such that a gain bandwidth associated with the amplifier is substantially independent of a direct current offset signal, wherein the amplifier is in communication with the direct current offset signal. The circuit can further include a demodulator, in communication with the amplifier, to demodulate an output signal associated with the amplifier so as to restore a substantially original frequency of the input signal to the output signal.

In general, in another aspect, a circuit is provided. The circuit includes an amplifier having an input to receive an input signal and a direct current offset signal, and an output producing an output signal in accordance with a gain; and a suppression circuit, coupled across the input and the output of the amplifier and operable to receive the output signal and produce a feedback signal that is fed back to the amplifier input such that a gain bandwidth associated with the amplifier is substantially independent of the received direct current offset signal.

Particular implementations can include one or more of the following features. The suppression circuit can produce the feedback signal for preventing the direct current offset signal from substantially affecting the output signal. The suppression circuit can include a filter to remove components of the output signal. The filter can include a third-order filter having at least two resistance elements coupled to at least two capacitive elements to maintain stability of a filter output signal. The suppression circuit can include a transconductance circuit to produce the feedback signal including amplifying components of the output signal. The circuit can further include a modulator, in communication with the input of the amplifier, the modulator adjusting a frequency of the input signal based on a carrier frequency; and a demodulator, in communication with the output of the amplifier, to restore a frequency of the output signal based on the carrier frequency. The amplifier can include a current feedback operational amplifier to preserve unity gain bandwidth in the output signal.

In general, in another aspect a method is provided. The method includes receiving an input signal for amplification; modulating the input signal; producing an output signal, including varying an input resistance, which includes a first switch resistance; applying a gain to the output signal for producing an amplified signal; and varying a feedback resistance, which includes a second switch resistance.

Particular implementations can include one or more of the following features. The feedback resistance can be substantially inversely proportionally to the input resistance to make the gain substantially independent of the first and second switch resistances. Producing can include varying the input resistance and the feedback resistance to produce a predetermined gain. Varying the input resistance can include activating one or more sets of a switch in series with a gain-controlling resistance. The method can further include activating at least one of the one or more sets in parallel to reduce the input resistance. Varying the feedback resistance can include activating one or more feedback resistance elements associated with the feedback resistance using an associated switch to vary the feedback resistance. The method can further include activating one or more of the feedback resistance elements to substantially equate the feedback resistance to the input resistance. The method can further include generating a first control signal for configuring the modulation resistance and a second control signal for configuring the feedback resistance. Generating the first and second control signals can include generating the first and second control signals based on a gain-setting signal. The method can further include receiving a direct current offset signal; and producing a feedback signal such that a gain bandwidth of an associated amplifier is substantially independent of a direct current offset. The method can further include demodulating the amplified signal so as to restore a substantially original frequency of the input signal.

In general, in another aspect, a method is provided. The method includes generating a first control signal and a second control signal for configuring a gain; receiving and modulating an input signal to produce a modulated signal, including varying an input resistance, which includes a first switch resistance responsive to the first control signal; amplifying the input signal; varying a feedback resistance, which includes a second switch resistance; receiving a direct current offset signal; producing a feedback signal such that a gain bandwidth associated with an amplifier is substantially independent of the received direct current offset signal; demodulating an output signal associated with an amplifier; and removing low frequency noise associated with the output signal.

In general, in another aspect, a method for direct current offset suppression in a chopper amplifier is provided. The method includes receiving an input signal; receiving a direct current offset signal; producing a feedback signal such that a gain bandwidth of an associated amplifier is substantially independent of the direct current offset signal; feeding back the feedback signal to be combined with the input signal; and amplifying the input signal and the feedback signal to produce an output signal according to a gain.

Particular implementations can include one or more of the following features. The method can further include producing the feedback signal for preventing a direct current offset from substantially affecting the output signal. The method can further include removing components of the output signal. The method can further include filtering the feedback signal and maintaining stability of a filter output signal. Producing the feedback signal can include amplifying components of the output signal. The method can further include adjusting a frequency of the input signal based on a carrier frequency; and restoring a frequency of the output signal based on the carrier frequency. The method can further include preserving unity gain bandwidth in the output signal.

In general, in another aspect a circuit is provided. The circuit includes means for receiving an input signal for amplification; means for, in communication with the means for receiving, modulating the input signal; means for, in communication with the means for modulation, producing an output signal including varying an input resistance, which includes a first switch resistance; means for, in communication with the means for producing, applying a gain to the output signal for producing an amplified signal; and means for, in communication with the means for amplifying, varying a feedback resistance, which includes a second switch resistance.

In general, in another aspect, a circuit for direct current offset suppression in a chopper amplifier is provided. The circuit includes means for receiving an input signal; means for receiving a direct current offset signal; means for, in communication with the means for receiving, producing a feedback signal such that a gain bandwidth of the output voltage is substantially independent of the direct current offset signal; means for, in communication with the means for producing, feeding back the feedback signal to be combined with the input signal; and means for, in communication with the means for receiving and the means for feeding back, amplifying an input signal and the feedback signal to produce an output signal according to a gain.

Aspects of the invention may offer one or more of the following advantages. A chopper amplifier is proposed that can produce a predefined gain, despite a varying modulation resistance or high input resistance. The chopper amplifier can suppress DC offset to maintain a sufficient output voltage swing. The chopper amplifier can include current feedback to preserve a bandwidth with increase in gain.

DETAILED DESCRIPTION

Figure 1:
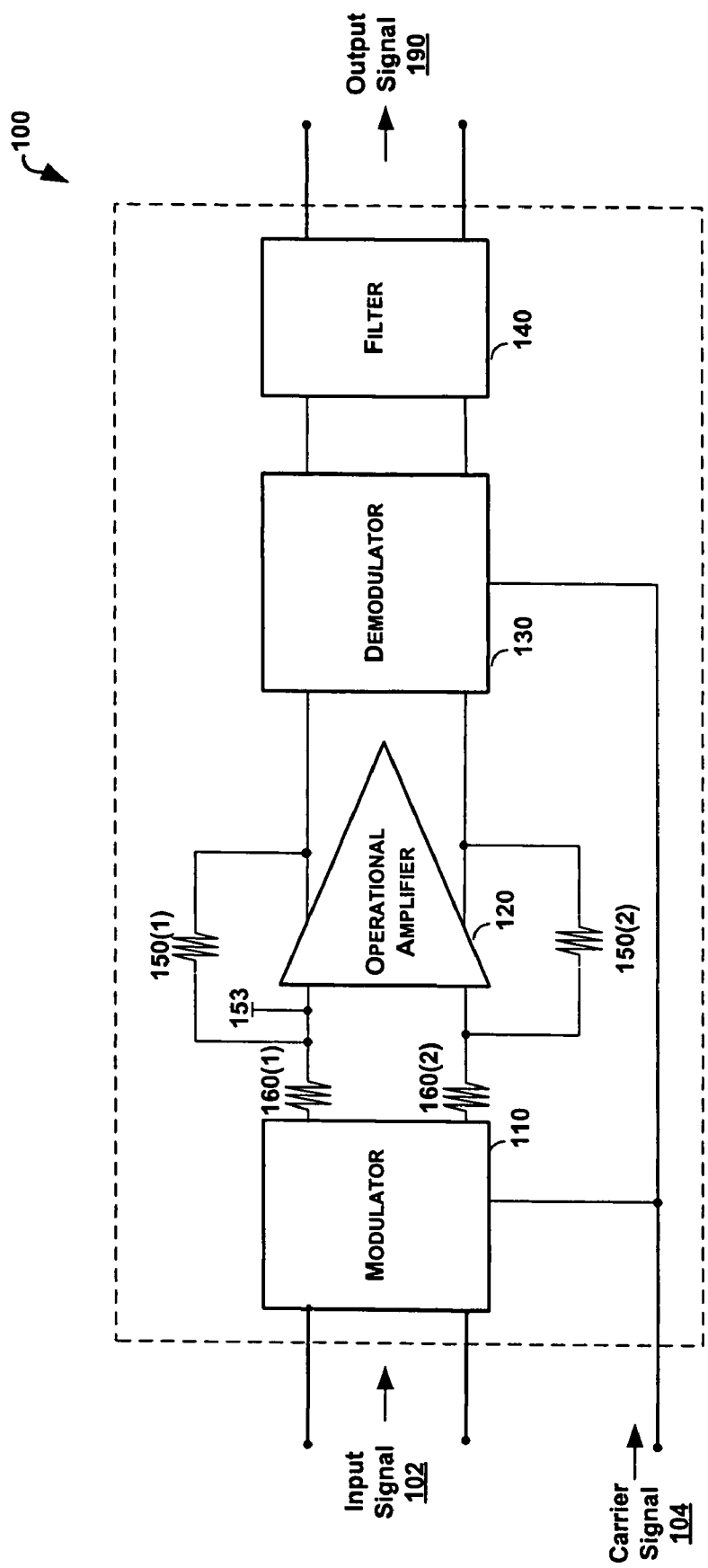
FIG. 1 is a schematic diagram illustrating a conventional chopper amplifier.
Figure 2A:
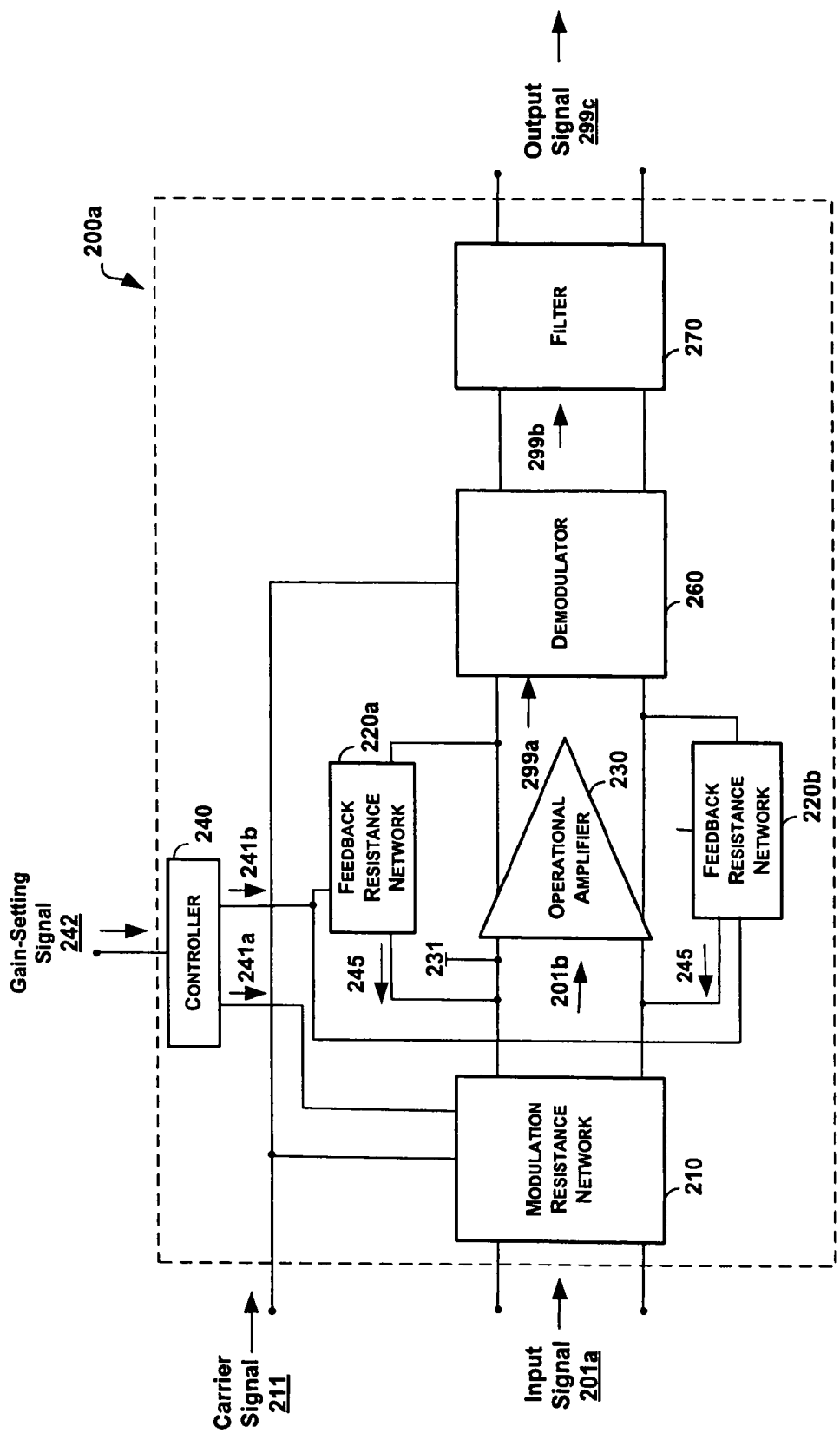
FIGS. 2A–C are schematic diagrams illustrating various implementations of a proposed chopper amplifier.

FIG. 2A is a schematic diagram illustrating a chopper amplifier 200a. Chopper amplifier 200a includes a modulation resistance network 210, feedback resistance networks 220a,b, an operational amplifier 230, a controller 240, a demodulator 260, and a filter 270.

Controller 240 includes an input coupled for receiving a gain-setting signal 242. Controller 240 includes outputs for producing control signals 241a,b. Gain-setting signal 242 can be a signal indicating a desired gain for operational amplifier 230. In one implementation, controller 240 activates switches in feedback resistance networks 220a,b to counteract the effect of switch resistance in modulation resistance network 210 that is incurred while modulating an input signal. The controller 240 can achieve the desired gain (i.e., an integral gain or a fractional gain) as a ratio of a number of feedback resistance units to a number of input resistance units. Resistance units can include resistance from, for example, modulation switches and resistance elements as described in greater detail below. Controller 240 produces control signal 241a to activate resistance units in modulation resistance network 210 and produces control signal 241b to activate resistance units in feedback resistance networks 220a,b. As a result, resistance units associated with modulation resistance network 210 offset resistance units associated with feedback resistance networks 220a,b. Gain is thereby substantially independent of, and not negatively affected by, the input resistance. In other words, the resulting gain is independent of modulation or switch resistance at an input and variations in absolute resistances (e.g., from temperature, processing or frequency).

Modulation resistance network 210 includes inputs coupled for receiving input signal 201a, a carrier signal 211, and control signal 241a. Modulation resistance network 210 produces an output signal 201b. In one implementation, modulation resistance network 210 transforms input signal 201a from a first frequency (or zero frequency for a direct current (DC) signal) to output signal 201b having an alternating current (AC) at a frequency of carrier signal 211. In addition, modulation resistance network 210 can vary the input resistance to operational amplifier 230 in order to produce a predetermined gain in operational amplifier 230 in accordance with control signal 241a. In one implementation, the input resistance includes resistance associated with switches used by modulation resistance network 210 to modulate input signal 201a.

Figure 3A:
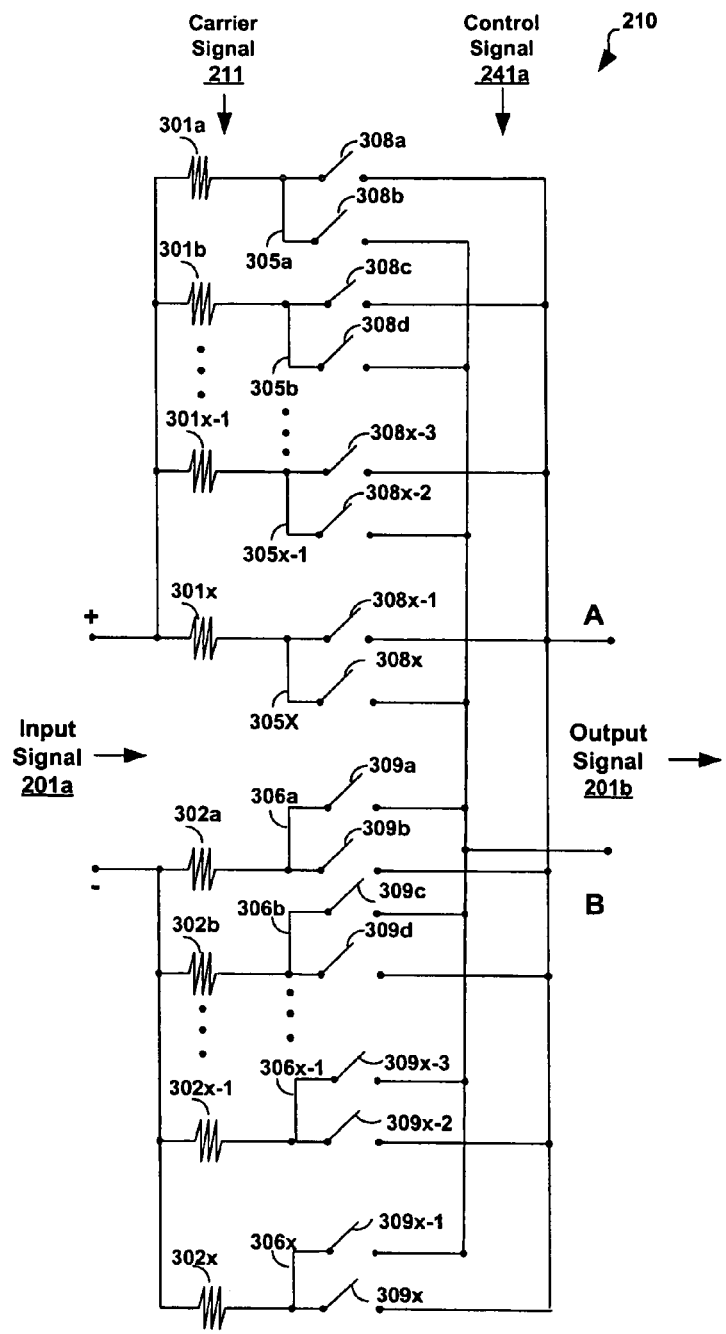
FIGS. 3A,B are schematic diagrams illustrating a modulation resistance network.

FIG. 3A is a schematic diagram illustrating one implementation of modulation resistance network 210. Modulation resistance network 210 includes gain-setting resistances 301a . . . 301x,302a . . . 302x, and switches 305a . . . 305x,306a . . . 306x. In the implementation shown, switches 305a . . . 305x,306a . . . 306x include upper portions (308a,c,x-3,x-1,309a,c,x-3,x-1) and lower portions (308b, d,x-2,x and 309b,d,x-2,x), respectively. Gain-setting resistances 301a . . . 301x,302a . . . 302x are coupled to receive input signal 201a. Switches 305a . . . 305x,306a . . . 306x are coupled to receive carrier signal 211 and control signal 241a. Gain-setting resistances 301a . . . 301x,302a . . . 302x are coupled in a series configuration with switches 305a . . . 305x,306a . . . 306x, respectively. Gain-setting resistance-switch combinations are coupled in a parallel configuration. Switches 305a . . . 305x,306a . . . 306x can include, for example, bipolar junction transistors, complementary metal oxide semiconductor transistors, and the like.

Modulation resistance network 210 is adjustable and activates resistance units with resistance-switch combinations responsive to control signal 241a. Of the activated switches, upper and lower portions open and close at the carrier frequency to activate associated resistance elements. If a desired gain increases, modulation resistance network 210 can activate additional resistance-switch combinations.

In one implementation of configuring input resistance, selected switches 305a . . . 305x,306a . . . 306x are enabled using control signal 241a which allows signal flow through an associated resistance at a frequency of carrier signal 211. For example, with only switch 305a receiving an enable signal, input resistance is substantially defined by a combination resistance of activated gain-setting resistance 301a and switch 305a. In another example, with both switches 305a and 305b receiving an enable signal, input resistance is substantially defined by a combination resistance of activated gain-setting resistance 301a and switch 305a in a parallel configuration with a combination resistance of activated gain-setting resistance 301b and switch 305b. The parallel configuration advantageously reduces overall input resistance. Enabling of input resistance units is discussed in greater detail below in associated with FIG. 3B.

In one implementation, an input signal is modulated to produce an output signal having an alternating current. For example, when a level of carrier signal 211 is high, enabled upper portions 308a,c,x-3,x-1 and 309a,c,x-3,x-1 of switches close, allowing the positive terminal associated with a differential input signal to be coupled to output A, and the negative terminal associated with the input signal to be coupled to output B. Conversely, when the level of carrier signal 211 is low, enabled lower portions 308b,d,x-2,x and 309b,d,x-2,x of switches close, allowing the negative terminal to be coupled to output A, and the positive terminal to be coupled to output B. As a result, a DC or AC input signal 201a is converted to an AC output signal 201b at a carrier frequency.

Figure 3B:
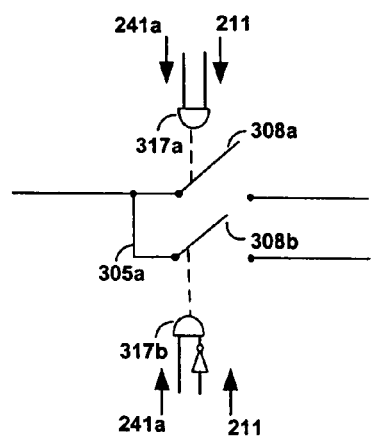

FIG. 3B is a schematic diagram illustrating one implementation of switch 305a in greater detail. In particular, a logical AND gate 317a receives as inputs control signal 241a and carrier signal 211. The output of AND gate 317a controls upper portion 308a of switch 305a. A logical AND gate 317b receives as inputs control signal 241a and a complement of carrier signal 211. The output of AND gate 317b controls lower portion 308b of switch 305a. In one implementation, logical AND gate 317a outputs a signal complementary to the output of logical AND gate 317b causing an upper portion 308a of switch 305a to activate complementary to a lower portion 308b. In one implementation, switches 305b . . . 305x,306a . . . 306x are coupled similarly to switch 305a as shown in FIG. 3B.

Referring again to FIG. 2A, feedback resistance networks 220a,b include inputs coupled to controller 240 for receiving control signal 241b. Feedback resistance networks 220a,b transform output signal 299a received from operational amplifier 230 to a feedback signal 245 that is provided as an input to operational amplifier 230. Feedback resistance networks 220a,b can adjust an associated feedback resistance in accordance with control signal 241b. In one implementation, the feedback resistance includes a resistance associated with switches to counter the switch resistance associated with the switches in modulation resistance network 210.

Figure 4B:
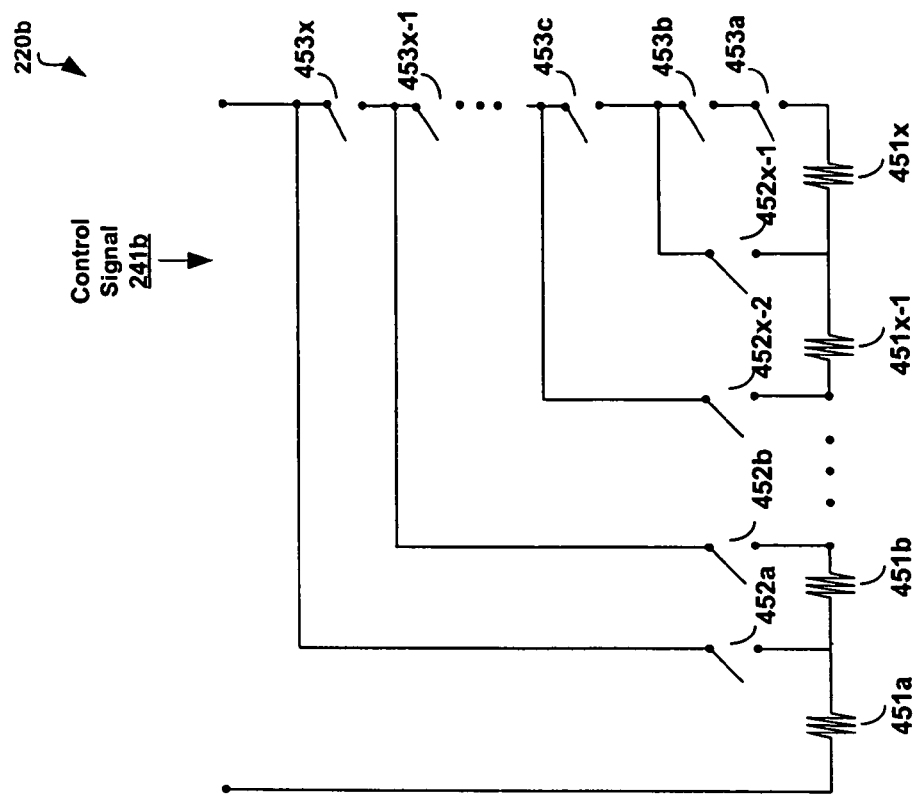
FIGS. 4A,B are schematic diagrams illustrating a feedback resistance network.
FIGS. 4C,D are schematic diagrams illustrating a feedback resistance network with fractional gain.
Figure 4A:
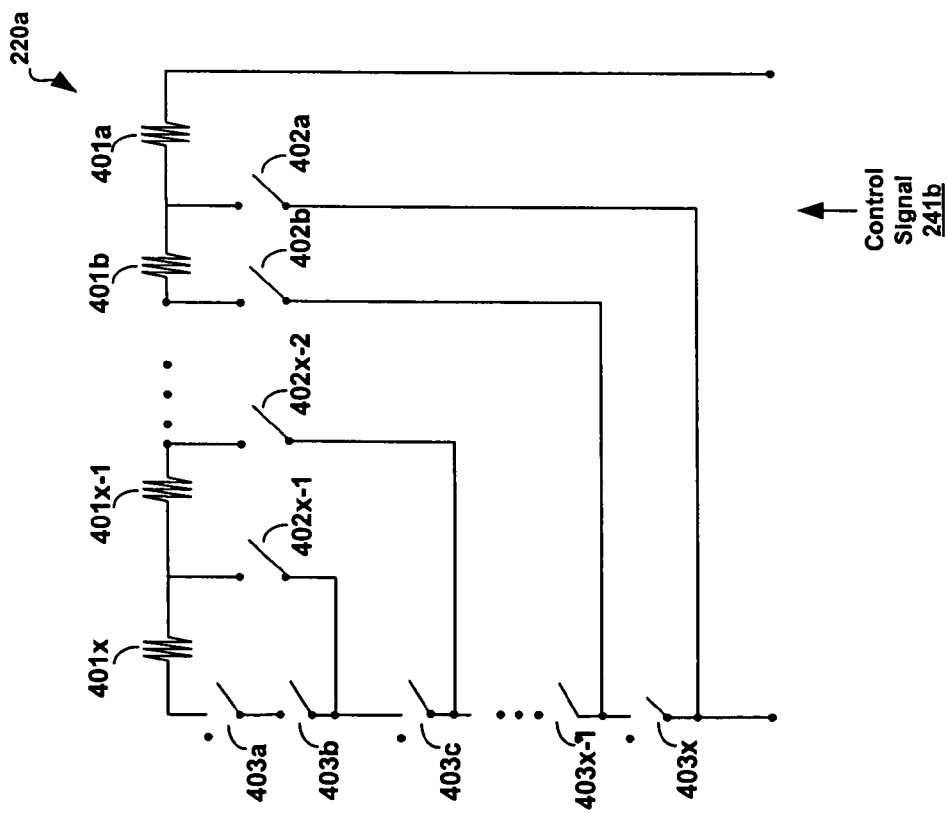

FIGS. 4A,B are schematic diagrams illustrating one implementation of feedback resistance networks 220a,b. Feedback resistance network 220a includes feedback resistances 401a . . . 401x, and switches 402a . . . 402x-1, 403a . . . 403x. Feedback resistances 401a . . . 401x are coupled in a series configuration. Switches 403a . . . 403x are coupled in a series configuration. Switches 402a . . . 402x-1 are coupled between feedback resistances 401a . . . 401x and switches 403a . . . 403x. Switches 402a . . . 402x-1,403a . . . 403x are coupled to receive control signal 241b.

Similar to modulation resistance network 210, controller 240 configures a feedback resistance of feedback resistance network 220a according to which of switches 402a . . . 402x-1 and 403a . . . 403x are open and which are closed. For example, to generate a feedback resistance defined by feedback resistance 401a, controller 240 closes switch 402a. In another example, to generate a feedback resistance defined by feedback resistances 401a and 401b, feedback resistance network 220a closes switches 402b and 403x. However, unlike modulation resistance network 210, carrier signal 211 is not needed to activate switches 402a . . . 402x-1,403a . . . 403x.

Furthermore, control signal 241b can coordinate feedback resistance network 220a to have resistance values substantially equating to resistance values of modulation resistance network 210 (FIGS. 2A,B) such that the gain depends on a number of resistance units selected. A unit resistance can be defined as $R_U = R_R + R_S$ including a resistance value associated with the resistances (i.e., $R_R$) and a resistance value associated with switches (i.e., $R_S$). Assuming input resistance matches output resistance, the relationship between gain and number of resistance units is illustrated as Gain=(N series unit resistance)/(M Parallel unit resistance)=$(NR_U)/(R_U/M)$=MN. Thus, control signal 241b can direct a parallel configuration of input resistances (e.g., in modulation resistance network 210) that is cancelled by a series configuration of feedback resistances (e.g., in feedback resistance network 220a,b) by generating a feedback resistance value substantially inversely proportional to an input resistance value.

In FIG. 4B, feedback resistance network 220b includes feedback resistances 451a . . . 451x and switches 452a . . . 452x-1,453a . . . 453x. Feedback resistance network 220b has a configuration that mirrors feedback resistance network 220a of FIG. 4A. Feedback resistance network 220b also has a similar operation to feedback resistance network 220a.

Figures 4C, 4D:
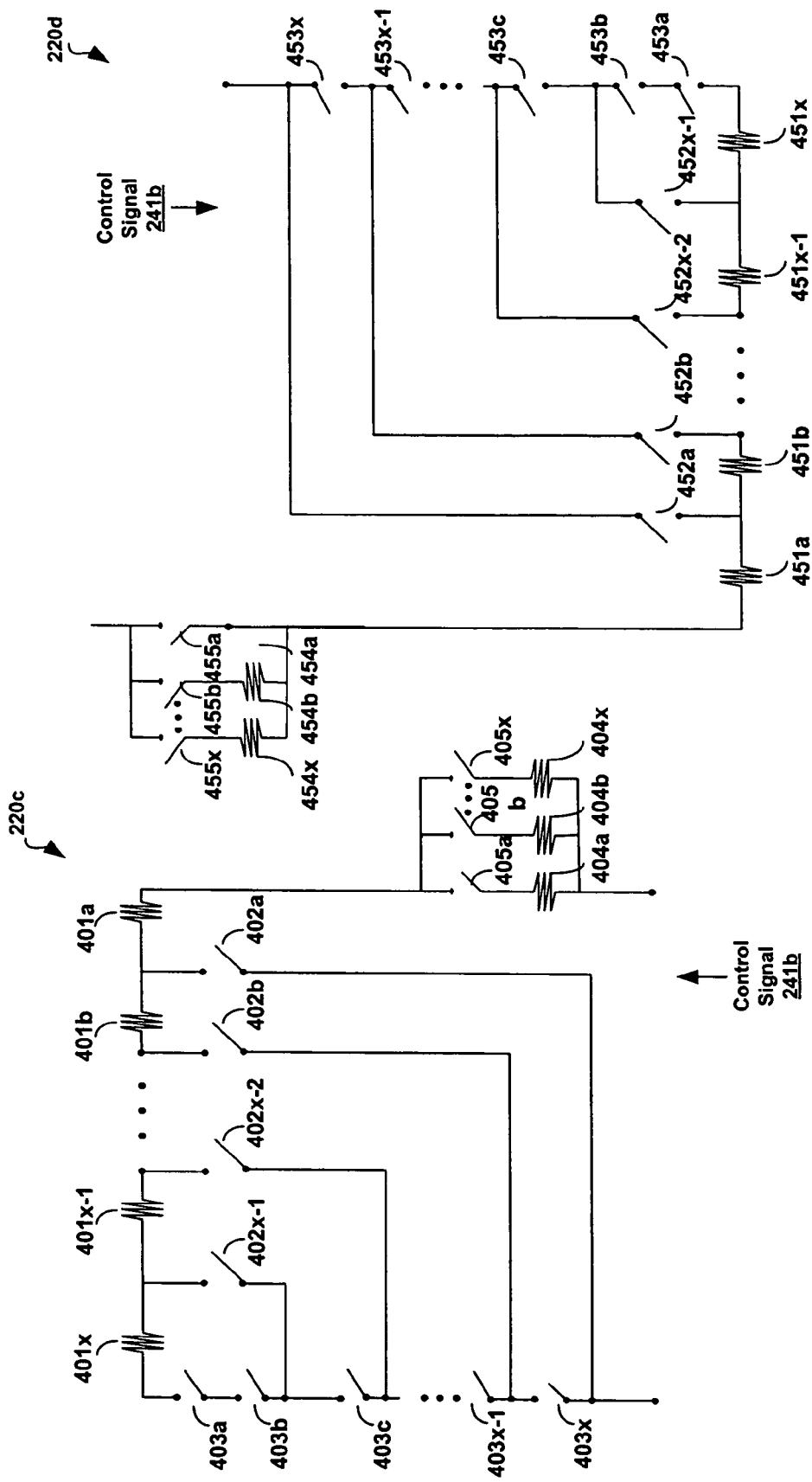

FIG. 4C is a schematic diagram illustrating one implementation of a feedback resistance network 220c with fractional gain. Feedback resistance network 220c includes feedback resistance network 220a (FIG. 4A), and in addition, resistances 404a . . . 404x and switches 405a . . . 405x. Switch-resistance combinations (i.e., 404a and 405a, 404b and 405b, and 404x and 405x) are coupled in a parallel configuration. Switch 405a is also coupled to resistance 401a. In one implementation, control signal 241a controls the gain by closing switches 405a . . . 405x. The gain can be expressed as Gain=(N series unit resistances and P parallel unit resistances in series)/(M parallel unit resistances)= $(NR_U + R_U/P)/(R_U/M)$=MN+M/P. Thus, feedback resistance network 220c generates a fractional gain (i.e., M/P). As above, the gain depends on the number of unit resistances selected.

In FIG. 4D, feedback resistance network 220d includes feedback resistance 220b (FIG. 4B), and in addition, resistances 454a . . . 454x and switches 455a . . . 455x. Feedback resistance network 220d has a configuration that mirrors feedback resistance network 220c of FIG. 4C. Feedback resistance network 220d also has a similar operation to feedback resistance network 220c.

Referring again to FIG. 2A, operational amplifier 230 includes first and second inputs coupled for receiving output signal 201b and a DC offset signal 231. Operational amplifier 230 includes an output coupled for producing output signal 299a. Feedback resistance networks 220a,b, are coupled across respective inputs/outputs of operational amplifier 230. Operational amplifier 230 receives output signal 201b and produces output signal 299a by increasing (or possibly decreasing) a magnitude of output signal 201b according to a gain. In one implementation, operational amplifier 230 produces high gains, such as 100 or more, for low frequency signals, such as DC to 20 kHz. In some implementations, operational amplifier 230 can be, for example, a voltage amplifier, an AC amplifier, a single-ended amplifier, a differential operational amplifier, and the like.

Figure 7:
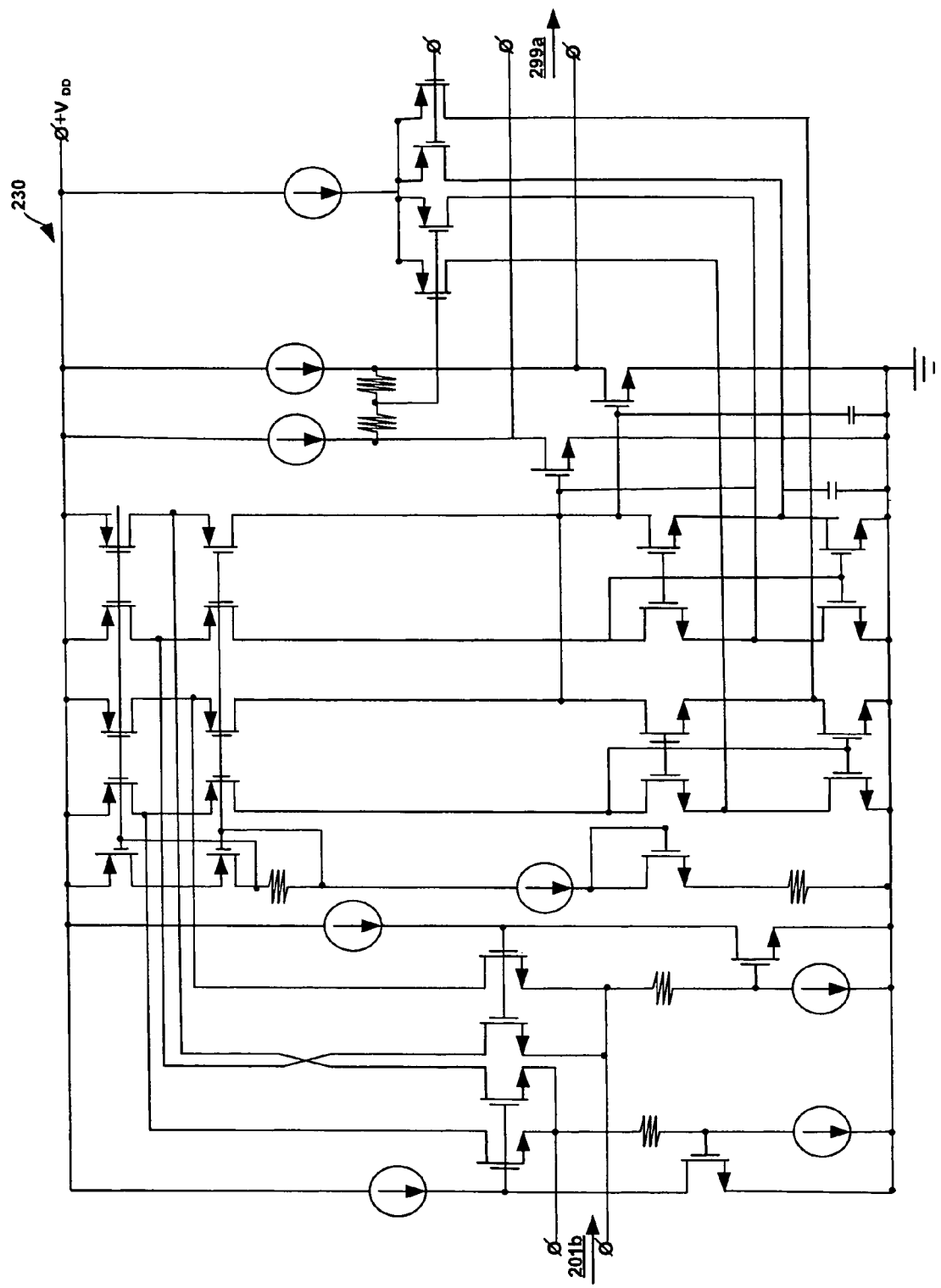
FIG. 7 is a schematic diagram illustrating a current feedback operational amplifier.

FIG. 7 is a schematic diagram illustrating one implementation of operational amplifier 230. This implementation is described in U.S. application Ser. No. 10/950,201, entitled "A FULLY DIFFERENTIAL CURRENT-FEEDBACK CMOS/BIPOLAR OPERATIONAL AMPLIFIER", filed on Sep. 24, 2004. Operational amplifier 230 is implemented in this example as a current feedback operational amplifier for high gain with large bandwidth. Operational amplifier 230 includes various combinations of components (e.g., transistors, resistances, and current sources), an example configuration of which is shown in FIG. 7. In the example shown, operational amplifier 230 transforms a differential current value associated with output signal 201b to a voltage value associated with output signal 299a.

Referring again to FIG. 2A, demodulator 260 includes an input coupled to operational amplifier 230 for receiving output signal 299a from operational amplifier 230 and an input coupled for receiving carrier signal 211. Demodulator 260 includes an output coupled for producing an output signal 299b. In operation, demodulator 260 demodulates output signal 299a at the frequency of carrier signal 211 to, for example, restore an original frequency of input signal 201a (e.g., restore to a DC signal).

Figure 5:
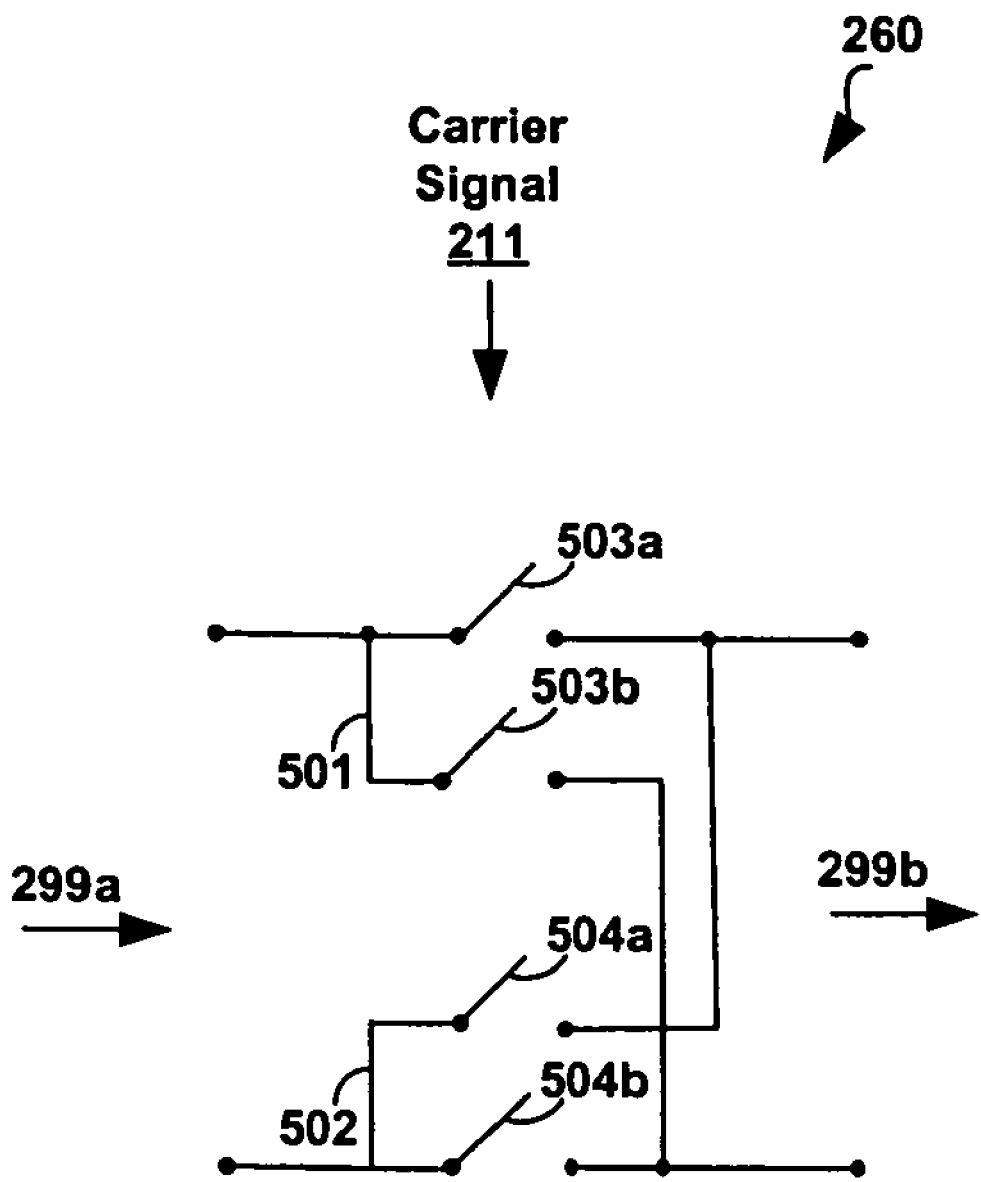
FIG. 5 is a schematic diagram illustrating a demodulator.

FIG. 5 is a schematic diagram illustrating one implementation of demodulator 260. Demodulator 260 includes switch 501 comprising an upper portion 503a and a lower portion 503b, and switch 502 comprising an upper portion 504a and a lower portion 504b. Switches 501,502 are coupled to receive output signal 299a and carrier signal 211. Switches 501,502 are also coupled to produce output signal 299b. In operation, upper portion 503a, and lower portion 504b can close when carrier signal 211 is high and lower portion 503b, and upper portion 504a can close when carrier signal 211 is low.

Filter 270 includes inputs coupled to demodulator 260 for receiving output signal 299b. Filter 270 includes outputs, forming an output of chopper amplifier 200a, coupled for producing output signal 299c. Filter 270 removes noise in output signal 299b generated by operational amplifier 230 and other artifacts (e.g., 2fc±fm, where fc is the frequency of carrier signal 211 and fm is the frequency of input signal 201a; and fc±fd, where fd includes low frequency noise components such as DC offset signal 231).

Figure 2B:
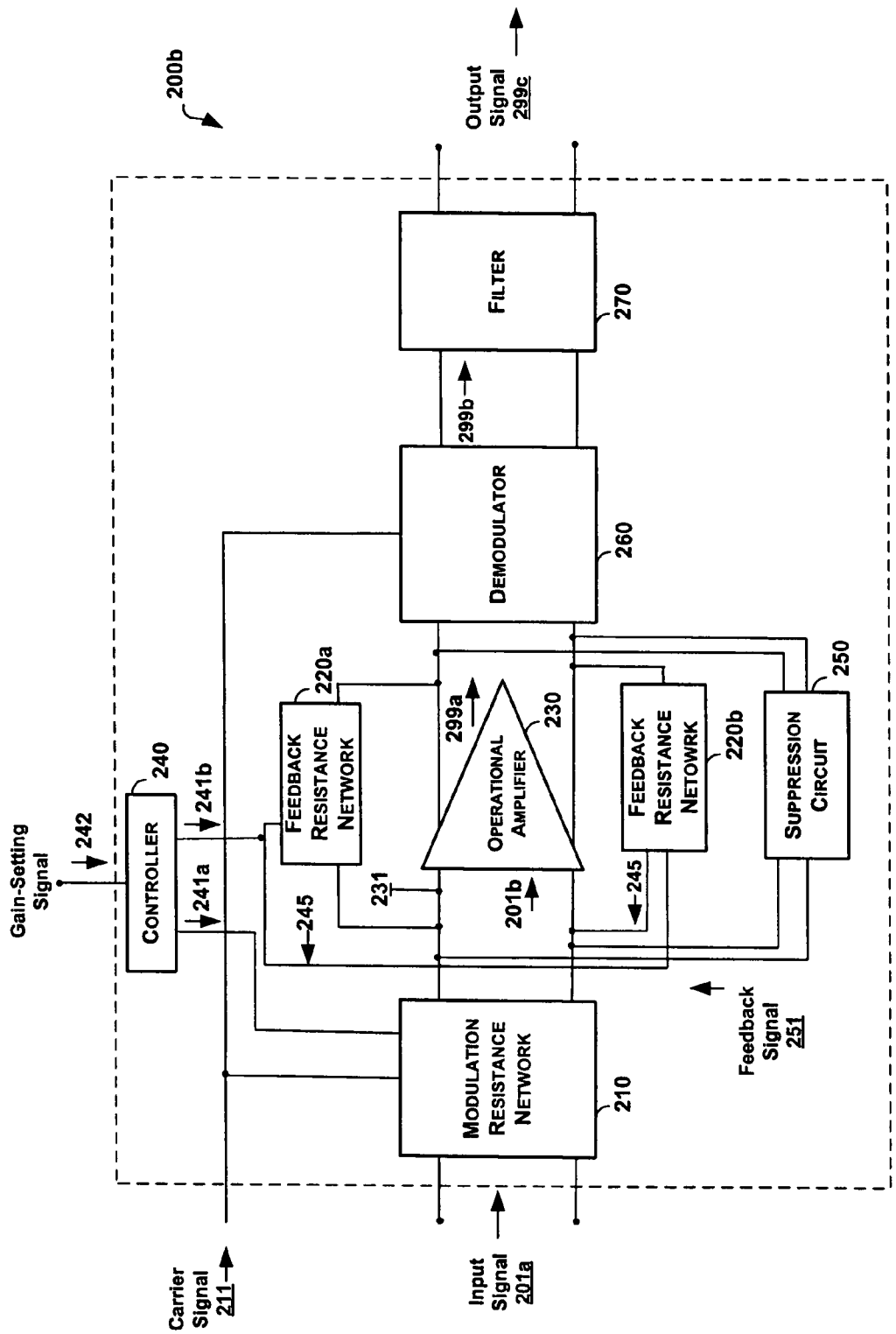

FIG. 2B is a schematic diagram illustrating a second implementation of a chopper amplifier, e.g., chopper amplifier 200b. Chopper amplifier 200b includes chopper amplifier 200a and a suppression circuit 250.

Suppression circuit 250 includes inputs and outputs coupled in communication with operational amplifier 230 for receiving output signal 299a and producing feedback signal 251. In one implementation, feedback signal 251 prevents DC offset signal 231 from appearing at the output of operational amplifier 230 as part of output signal 299a. In one implementation, suppression circuit 250 is integrated on a common substrate with operational amplifier 230.

Figure 6:
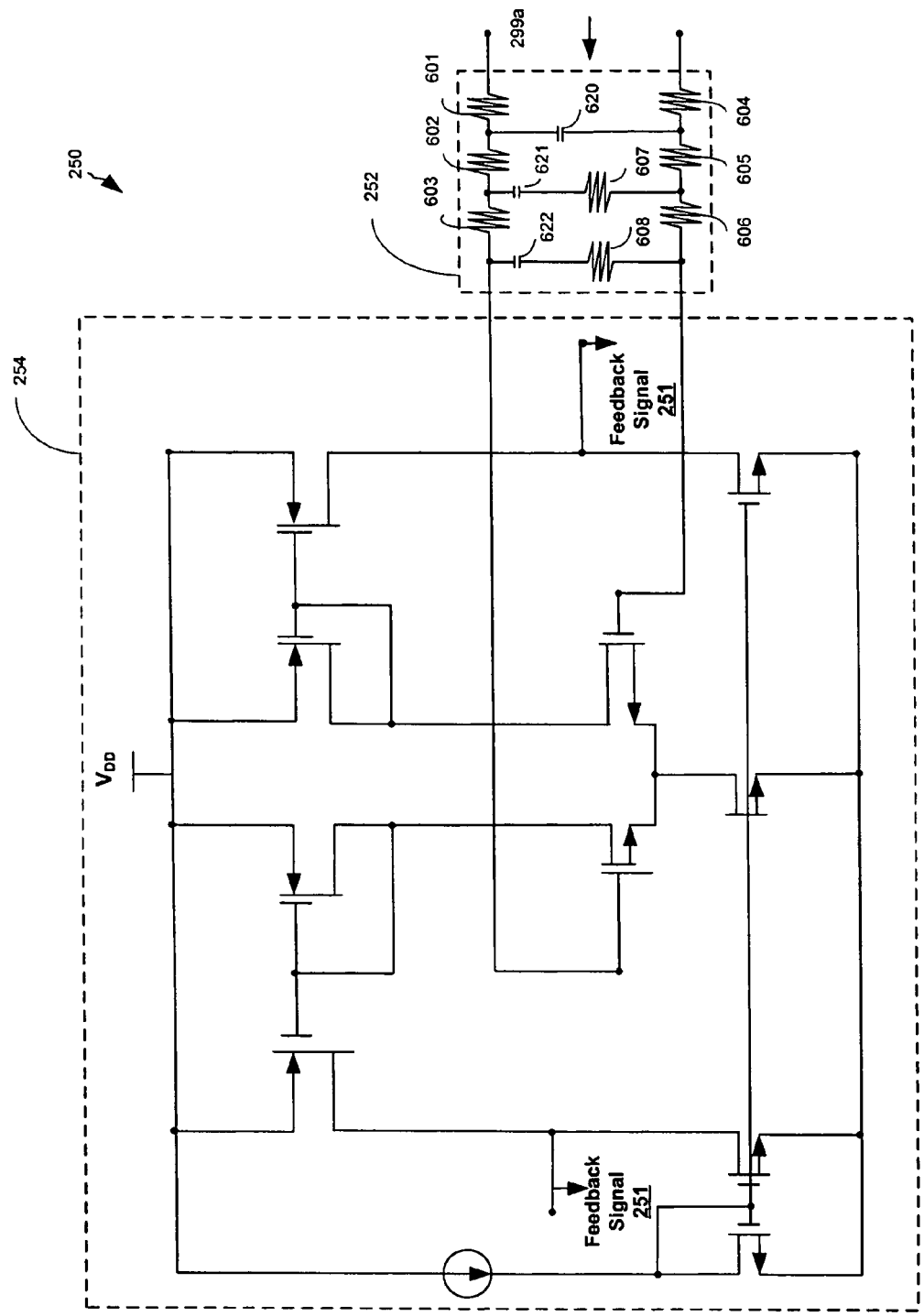
FIG. 6 is a schematic diagram illustrating a suppression circuit.

FIG. 6 is a schematic diagram illustrating one implementation of suppression circuit 250. Suppression circuit 250 includes a low-pass filter 252 in communication with a transconductance circuit 254. Low-pass filter 252 further includes resistances 601–608 and capacitors 620–622.

Low-pass filter 252 includes inputs to receive output signal 299a. Low-pass filter 252 can include various components (e.g., resistances and capacitors), an example configuration of which is shown in FIG. 6. In particular, resistances 601,602,603 are coupled sequentially in series as are resistances 604,605,606. Capacitor 620 is coupled between resistances 601,602 on a first terminal end and resistances 604,605 on a second terminal end. A first RC combination (capacitor 621 and resistance 607) is coupled between resistances 602,603 on a terminal end of capacitor 621 and is coupled between resistances 605,606 on a terminal end of resistance 607. A second RC combination (capacitor 622 and resistance 608) is coupled to resistance 603 on a terminal end of capacitor 622 and coupled to resistance 606 on a terminal end of resistance 608. Low-pass filter 252 removes high frequency components of output signal 299a to isolate a DC offset (or low frequency) component. More specifically, in the implementation shown, low-pass filter 252 is a third-order filter that inserts zeroes to maintain stability of the feedback loop (e.g., through the first and second RC combinations).

Transconductance circuit 254 includes outputs that provide a feedback signal 251 to operational amplifier 230. Transconductance circuit 254 can include various components (e.g., transistors and a current source), an example configuration of which is also shown in FIG. 6. Transconductance circuit 254 amplifies the DC offset component of output signal 299a to produce feedback signal 251. In one implementation, an output voltage of output signal 299a is transformed to a differential current of feedback signal 251. Transconductance circuit 254 can have a high impedance output with a rail-to-rail signal swing.

Figure 2C:
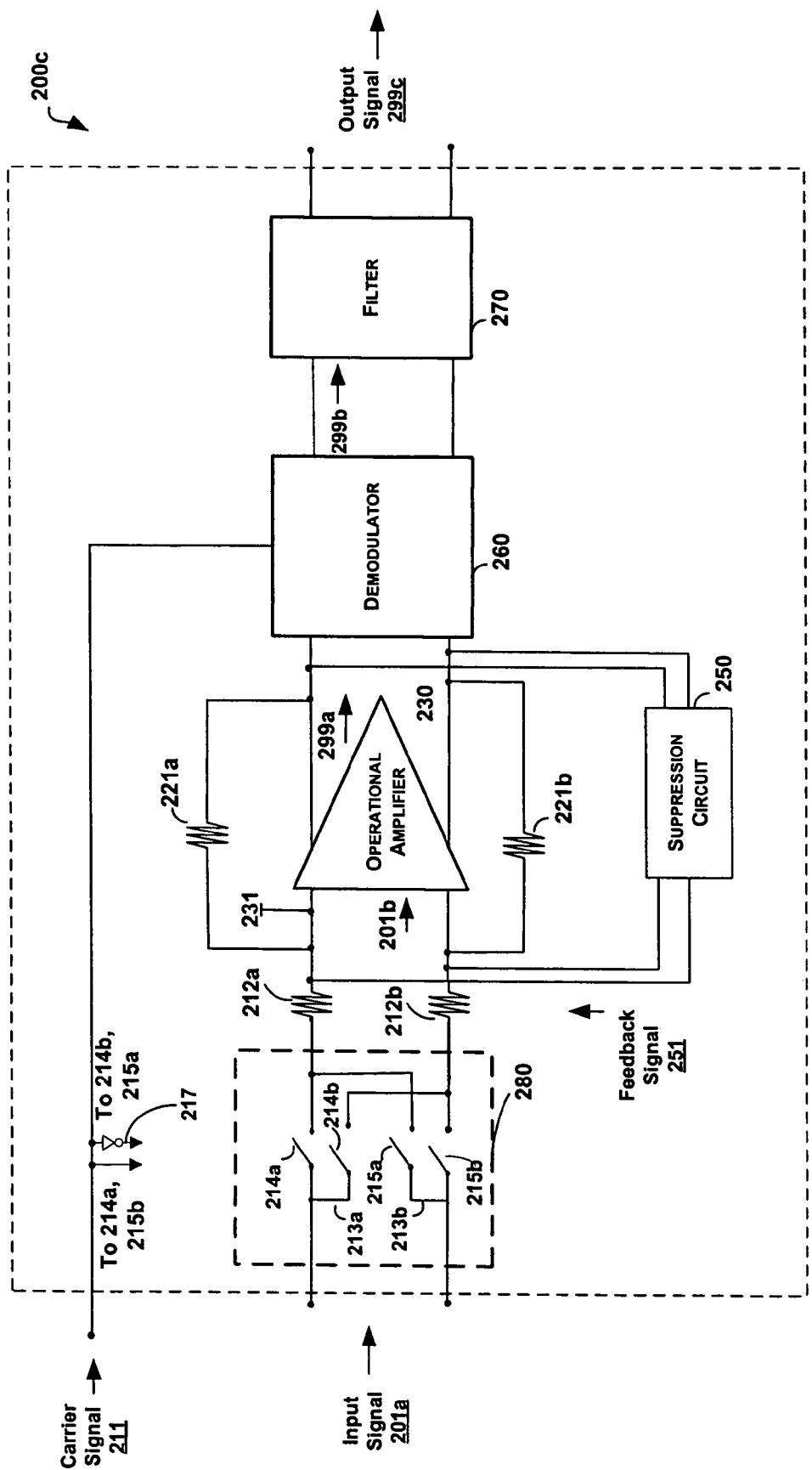

FIG. 2C is a schematic diagram illustrating a third implementation of a chopper amplifier, e.g., chopper amplifier 200c. Chopper amplifier 200c includes input resistor resistances 212a,b, feedback resistances 221a,b, operational amplifier 230, suppression circuit 250, demodulator 260, filter 270, and modulator 280. In contrast to chopper amplifiers 200a,b of FIGS. 2A,B, chopper amplifier 200c does not require a controller 240, or modulation or feedback resistance networks 210,220a,b.

Modulator 280 further comprises switch 213a having an upper portion 214a and a lower portion 214b, and switch 213b having an upper portion 215a and a lower portion 215b. Switches 213a,b receive as inputs input signal 201a, carrier signal 211 and complementary carrier signal 217. Switches 213a,213b convert input signal 201a to output signal 201b modulated at a frequency of carrier signal 211. Input resistance elements 212a,b operate to provide an input resistance to operational amplifier 230. Likewise, feedback resistance elements 221a,b operate to provide a feedback resistance to operational amplifier 230.

Figure 8:
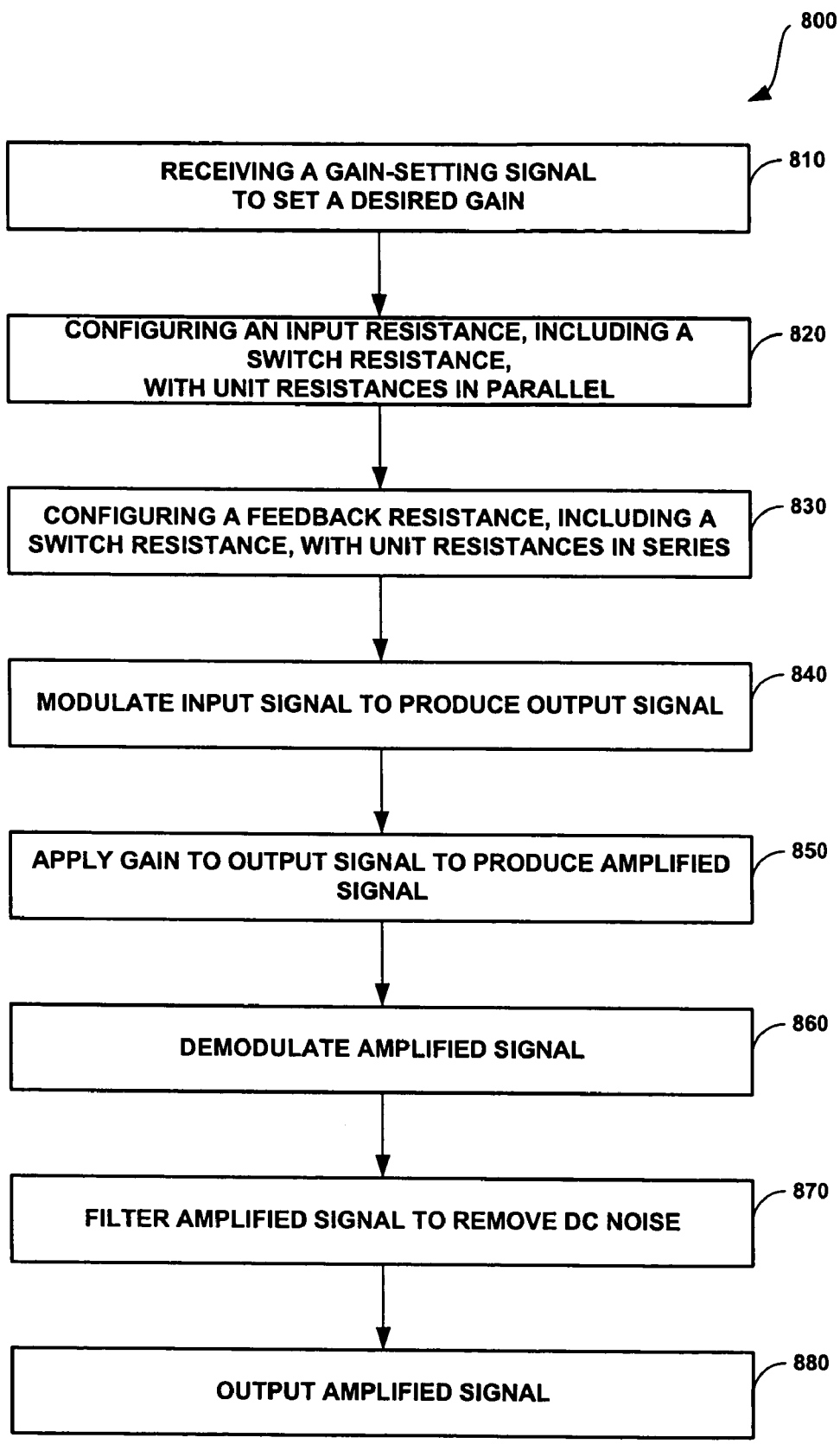
FIG. 8 is a flow diagram illustrating a method for programming a gain of a chopper amplifier.

FIG. 8 is a flow diagram illustrating a method 800 for programming a gain of an amplifier (e.g., chopper amplifiers 200a–b). A gain-setting signal is received 810 to set a desired gain (e.g., gain-setting signal 242 by controller 240). An input resistance, including a switch resistance, is configured 820 (e.g., by controller 240). For example, a plurality of resistances (e.g., switches and resistances in modulation resistance network 210) associated with an input resistance can be configured in parallel.

A feedback resistance, including a switch resistance, is configured 830 according to the input resistance (e.g., by controller 240). For example, a plurality of unit resistances associated with the feedback resistance (e.g., switches and resistances in feedback resistance networks 220a,220b, 220c,220d) can be configured in series to have a substantially inverse value of a value of the resistances associated with the input resistance. As a result, the switch resistance of the feedback resistance can offset the switch resistance of the input resistance to achieve high gain in an operational amplifier.

An input signal (e.g., input signal 201a) is modulated 840 to produce an output signal (e.g., output signal 201b). The output signal is amplified 850 (e.g., by operational amplifier 230) to generate an amplified signal (e.g., output signal 299a). The amplified signal is demodulated 860 (e.g., by demodulator 260) to its original frequency. The amplified signal is filtered 870 (e.g., by filter 270) to remove DC noise and output producing the amplified signal 880.

Figure 9:
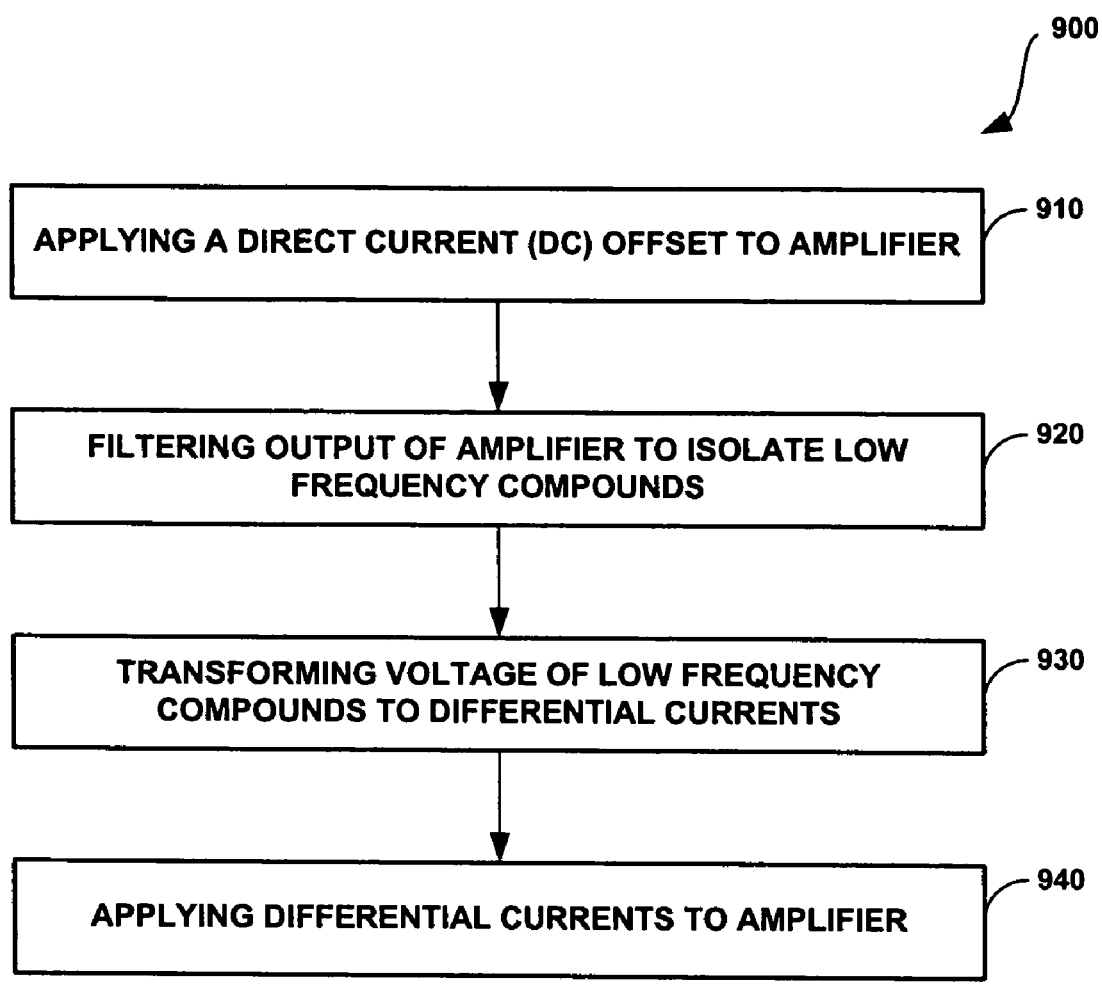
FIG. 9 is a flow diagram illustrating a method for direct current (DC) offset suppression in a chopper amplifier.

FIG. 9 is a flow diagram illustrating a method 900 for DC suppression in an operational amplifier (e.g., operational amplifier 230). Generally, a processed output signal is fed back (e.g., by suppression circuit 250) to drive the operational amplifier. More specifically, a DC offset signal (e.g., DC offset signal 231) is applied 910 to the operational amplifier. The output signal of the amplifier is filtered 920 (e.g., by filter 252) to isolate low frequency components. In one implementation, a voltage of low frequency components is transformed 930 (e.g., by transconductance circuit 254) to differential currents. The differential currents are applied 940 (e.g., by transconductance circuit 254) to the operational amplifier to suppress DC offset.

A chopper amplifier, e.g., chopper amplifiers 200a–c, can be implemented as a component of an analog and/or digital circuit application, for example, high gain DC/low frequency preamplifiers for sensor based instrumentation. In one implementation, the chopper amplifier can be included on a common substrate or an integrated circuit formed from silicon, gallium arsenide, and the like. In another implementation, the chopper amplifier can be included on a common printed circuit board having separate substrates.

A number of implementations have been described. Nevertheless, it will be understood that various modifications may be made. For example, while the described implementation processes differential signals, in other implementations, single-ended signals can be processed. Accordingly, other implementations are within the scope of the following claims.

What is claimed is:

1. A circuit, comprising:
   a controller to generate a first control signal and a second control signal for configuring a gain;
   an adjustable modulation resistance network, in communication with the controller, to receive and modulate an input signal to produce a modulated signal, the adjustable modulation resistance network varying an input resistance, which includes a first switch resistance, responsive to the first control signal;
   an amplifier having an input and an output and in communication with the adjustable modulation resistance network, the amplifier in communication to receive a direct current offset signal;
   an adjustable feedback resistance network, in communication with the controller and the amplifier, the adjustable feedback resistance network varying a feedback resistance, which includes a second switch resistance, the feedback resistance being substantially inversely proportional to the input resistance, to make the gain substantially independent of the first and second switch resistances;
   a suppression circuit, in communication with the input and the output of the amplifier, to produce a feedback signal such that a gain bandwidth associated with the amplifier is substantially independent of the direct current offset signal;
   a demodulator, in communication with the amplifier, to demodulate the output signal associated with the amplifier so as to restore a substantially original frequency of the input signal; and
   a filter, in communication with the demodulator, to remove low frequency noise associated with the output signal.

2. A circuit, comprising:
   an adjustable modulation resistance network to receive and modulate an input signal and to produce a modulated signal, the adjustable modulation resistance network varying an input resistance which includes a first switch resistance;
   an amplifier having an input and an output, in communication with the adjustable modulation resistance network; and
   an adjustable feedback resistance network in communication with the amplifier, the adjustable feedback resistance network varying a feedback resistance, which includes a second switch resistance substantially equal to the first switch resistance.

3. The circuit of claim 2, wherein the feedback resistance is substantially inversely proportional to the input resistance to make a gain substantially independent of the first and second switch resistances.

4. The circuit of claim 2, wherein the adjustable modulation resistance network varies the input resistance and the adjustable feedback resistance network adjusts the feedback resistance to produce a predetermined gain in the amplifier.

5. The circuit of claim 2, wherein the adjustable modulation resistance network includes sets of a switch in series with a gain-controlling resistance, and is operable to activate one or more of the sets to vary the input resistance.

6. The circuit of claim 5, wherein the adjustable modulation resistance network is operable to activate at least one of the one or more sets in parallel to reduce the input resistance.

7. The circuit of claim 2, wherein the adjustable feedback resistance network includes sets of a switch in series with a feedback resistance, wherein the adjustable feedback resistance network activates one or more feedback resistances using an associated switch to vary the feedback resistance.

8. The circuit of claim 7, wherein the adjustable feedback resistance network activates one or more of the sets of the switch in series with the feedback resistance to substantially equate the feedback resistance to the input resistance.

9. The circuit of claim 2, further comprising:
   a controller, in communication with the adjustable modulation and adjustable feedback resistance networks, the controller generating a first control signal for configuring the adjustable modulation resistance network and a second control signal for configuring the adjustable feedback resistance network.

10. The circuit of claim 9, wherein the controller produces the first and second control signals based on a gain-setting signal.

11. The circuit of claim 2, further comprising:
    a suppression circuit, in communication with the amplifier, to produce a feedback signal that is fed back to the amplifier such that a gain bandwidth associated with the amplifier is substantially independent of a direct current offset signal, wherein the amplifier is in communication with the direct current offset signal.

12. The circuit of claim 2, further comprising:
    a demodulator, in communication with the amplifier, to demodulate an output signal associated with the amplifier so as to restore a substantially original frequency of the input signal to the output signal.

13. A circuit, comprising:
    an amplifier having an input to receive an input signal and a direct current offset signal and an output producing an output signal in accordance with a gain; and
    a suppression circuit, coupled across the input and the output of the amplifier and operable to receive the output signal and produce a feedback signal that is fed back to the amplifier input such that a gain bandwidth associated with the amplifier is substantially independent of the received direct current offset signal.

14. The circuit of claim 13, wherein the suppression circuit produces the feedback signal for preventing the direct current offset from substantially affecting a voltage swing of the output signal.

15. The circuit of claim 13, wherein the suppression circuit includes:
    a filter.

16. The circuit of claim 15, wherein the filter includes:
    a third-order filter having at least two resistance elements in communication with at least two capacitive elements.

17. The circuit of claim 13, wherein the suppression circuit includes:
    a transconductance circuit to produce the feedback signal including amplifying components of the output signal.

18. The circuit of claim 13, further comprising:
a modulator, in communication with the input of the amplifier, the modulator adjusting a frequency of the input signal based on a carrier frequency; and
a demodulator, in communication with the output of the amplifier, to restore a frequency of the output signal based on the carrier frequency.

19. The circuit of claim 13, wherein the amplifier includes a current feedback operational amplifier to preserve unity gain bandwidth in the output signal.

20. A method, comprising:
receiving an input signal for amplification;
modulating the input signal;
producing an output signal including varying an input resistance, which includes a first switch resistance;
applying a gain to the output signal for producing an amplified signal; and
varying a feedback resistance, which includes a second switch resistance.

21. The method of claim 20, wherein the feedback resistance is substantially inversely proportionally to the input resistance to make the gain substantially independent of the first and second switch resistances.

22. The method of claim 20, wherein producing includes varying the input resistance and the feedback resistance to produce a predetermined gain.

23. The method of claim 20, wherein varying the input resistance includes activating one or more of sets of a switch in series with a gain-controlling resistance.

24. The method of claim 23, further comprising
activating at least one of the one or more sets in parallel to reduce the input resistance.

25. The method of claim 20, wherein varying the feedback resistance comprises activating one or more feedback resistance elements associated with the feedback resistance using an associated switch to vary the feedback resistance.

26. The method of claim 25, further comprising:
activating one or more of the feedback resistance elements to substantially equate the feedback resistance to the input resistance.

27. The method of claim 20, further comprising:
generating a first control signal for configuring the modulation resistance and a second control signal for configuring the feedback resistance.

28. The method of claim 27, wherein generating the first and second control signals includes generating the first and second control signals based on a gain-setting signal.

29. The method of claim 20, further comprising:
receiving a direct current offset signal; and
producing a feedback signal such that a gain bandwidth of an associated amplifier is substantially independent of the direct current offset signal.

30. The method of claim 20, further comprising:
demodulating the amplified signal so as to restore a substantially original frequency of the input signal.

31. A method, comprising:
generating a first control signal and a second control signal for configuring a gain;
receiving and modulating an input signal to produce a modulated signal, including varying an input resistance, which includes a first switch resistance responsive to the first control signal;
amplifying the input signal;
varying a feedback resistance, which includes a second switch resistance;
receiving a direct current offset signal;
producing a feedback signal such that a gain bandwidth associated with the amplifier is substantially independent of the received direct current offset signal;
demodulating an output signal associated with an amplifier; and
removing low frequency noise associated with the output signal.

32. A method for direct current offset suppression in a chopper amplifier, comprising:
receiving an input signal;
receiving a direct current offset signal;
producing a feedback signal such that a gain bandwidth of an associated amplifier is not substantially affected by the direct current offset signal;
feeding back the feedback signal to be combined with the input signal; and
amplifying the input signal and the feedback signal to produce an output signal according to a gain.

33. The method of claim 32, further comprising:
producing the feedback signal for preventing the direct current offset from substantially affecting the output signal.

34. The method of claim 32, further including:
removing components of the output signal.

35. The method of claim 32, further including
filtering the feedback signal; and
maintaining stability of a filter output signal.

36. The method of claim 32, wherein producing the feedback signal includes amplifying components of the output signal.

37. The method of claim 32, further comprising:
adjusting a frequency of the input signal based on a carrier frequency; and
restoring a frequency of the output signal based on the carrier frequency.

38. The method of claim 32, further including:
preserving unity gain bandwidth in the output signal.

* * * * *